United States Patent
Bohr

(10) Patent No.: US 6,982,225 B2
(45) Date of Patent: Jan. 3, 2006

(54) INTERPOSER AND METHOD OF MAKING SAME

(75) Inventor: Mark T. Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 10/660,421

(22) Filed: Sep. 10, 2003

(65) Prior Publication Data

US 2005/0017333 A1    Jan. 27, 2005

Related U.S. Application Data

(62) Division of application No. 10/020,316, filed on Oct. 29, 2001, now Pat. No. 6,671,947, which is a division of application No. 09/340,530, filed on Jun. 28, 1999, now Pat. No. 6,617,681.

(51) Int. Cl.
H01L 21/31    (2006.01)

(52) U.S. Cl. .................. 438/639; 438/637; 438/702

(58) Field of Classification Search .............. 438/639, 438/637, 702; 257/774, 700, 758, 776, 773, 257/368, 379, 532; 29/846
See application file for complete search history.

(56) References Cited

U.S. PATENT DOCUMENTS

| | | | |
|---|---|---|---|
| 3,577,037 A | 5/1971 | Pietro et al. | |
| 3,648,131 A | 3/1972 | Stuby | |
| 4,074,342 A | 2/1978 | Honn et al. | |
| 4,125,933 A | 11/1978 | Baldwin et al. | |
| 4,349,862 A | 9/1982 | Bajorek et al. | |
| 4,394,712 A | 7/1983 | Anthony | |
| 4,811,082 A | 3/1989 | Jacobs et al. | |
| 4,837,123 A | 6/1989 | Kato et al. | |
| 4,866,507 A | 9/1989 | Jacobs et al. | |
| 5,063,177 A | 11/1991 | Geller et al. | |
| 5,136,471 A | 8/1992 | Inasaka | |
| 5,191,224 A | 3/1993 | Tazunoki et al. | |
| 5,191,404 A | 3/1993 | Wu et al. | |
| 5,258,648 A | 11/1993 | Lin | |
| 5,413,489 A | 5/1995 | Switky | |
| 5,424,920 A | 6/1995 | Miyake | |
| 5,473,120 A | 12/1995 | Ito et al. | |
| 5,485,039 A | 1/1996 | Fujita et al. | |
| 5,529,950 A | 6/1996 | Hoenlein et al. | |
| 5,530,288 A | 6/1996 | Stone | |
| 5,574,630 A | 11/1996 | Kresge et al. | |
| 5,623,160 A | 4/1997 | Liberkowski | |
| 5,635,767 A | 6/1997 | Wenzel et al. | |

(Continued)

FOREIGN PATENT DOCUMENTS

EP    05939 66 A1    4/1994

Primary Examiner—Laura M. Schillinger
(74) Attorney, Agent, or Firm—Blakely, Sokoloff, Taylor & Zafman LLP

(57) ABSTRACT

A structure suitable for connecting an integrated circuit to a supporting substrate wherein the structure has thermal expansion characteristics well-matched to the integrated circuit is an interposer. The integrated circuit and the interposer are comprised of bodies that have substantially similar coefficients of thermal expansion. The interposer has a first surface adapted to electrically and mechanically couple to the integrated circuit. The interposer has a second surface adapted to electrically and mechanically couple to a supporting substrate. Electrically conductive vias provide signal pathways between the first surface and the second surface of the interposer. Various circuit elements may be incorporated into the interposer. These circuit elements may be active, passive, or a combination of active and passive elements.

7 Claims, 11 Drawing Sheets

U.S. PATENT DOCUMENTS

| | | |
|---|---|---|
| 5,640,049 A | 6/1997 | Rostoker et al. |
| 5,644,167 A | 7/1997 | Weiler et al. |
| 5,719,438 A | 2/1998 | Beilstein, Jr. et al. |
| 5,726,499 A * | 3/1998 | Irinoda ..................... 257/774 |
| 5,776,829 A | 7/1998 | Homma et al. |
| 5,777,383 A | 7/1998 | Stager et al. |
| 5,790,384 A | 8/1998 | Ahmad et al. |
| 5,828,106 A | 10/1998 | Sato |
| 5,986,338 A | 11/1999 | Nakajima |
| 6,052,287 A | 4/2000 | Palmer et al. |
| 6,175,160 B1 | 1/2001 | Paniccia et al. |
| 6,187,671 B1 * | 2/2001 | Irinoda ..................... 438/639 |
| 6,617,681 B1 * | 9/2003 | Bohr ..................... 257/700 |
| 6,671,947 B2 * | 1/2004 | Bohr ..................... 29/846 |

* cited by examiner

| COUPLE AN IC AND AN INTERPOSER | 302 |

| COUPLE A CIRCUIT SUBSTRATE AND THE INTERPOSER | 304 |

FIG. 17

INTERPOSER AND METHOD OF MAKING SAME

This application is a divisional of U.S. patent application Ser. No. 10/020,316, filed Oct. 29, 2001 now U.S. Pat. No. 6,671,947, which is a divisional of U.S. Patent application Ser. No. 09/340,530, filed Jun. 28, 1999, now U.S. Pat. No. 6,617,681.

BACKGROUND OF THE INVENTION

1. Field of the Invention

The invention relates to connections between integrated circuits and a supporting substrate such as a printed circuit board. More particularly, the present invention relates to an interposer for coupling an integrated circuit to a supporting substrate.

2. Background

Integrated circuits have been manufactured for many years. Conventionally, such manufacturing involves integrating various active and passive circuit elements into a piece of semiconductor material, referred to as a die, and the die is encapsulated into a ceramic or plastic package. These packages are then typically attached to a printed circuit board by connecting pins, arranged along the periphery of the package. An electronic system can be formed by connecting various integrated circuit packages to a printed circuit board.

As advances in semiconductor manufacturing technology led to substantially increased numbers of transistors on each integrated circuit, it became possible to correspondingly increase the functionality of each integrated circuit. In turn, increased functionality resulted in the need to increase the number of input/output (I/O) connections between the integrated circuit and the rest of the electronic system of which the integrated circuit was a part. One adaptation designed to address the increased need for I/O connections was to simply add additional pins to the package. Unfortunately, adding pins to the package increased the area consumed by the package. A further adaptation designed to address the increased need for I/O connections without consuming an unacceptably large amount of area was the development of pin grid array (PGA) and ball grid array (BGA) packages. In such a package, a large number of I/O connection terminals are disposed in a two dimensional array over a substantial portion of a major surface of the package. These PGA and BGA packages typically contain an integrated circuit die, and are attached to a supporting substrate such as a printed circuit board.

Although PGA and BGA packages provide a space-saving solution for integrated circuits needing a large number of I/O connections, the materials from which they are manufactured typically do not provide a good match with the material of the integrated circuit die in terms of their respective coefficients of thermal expansion.

What is needed is a structure suitable for electrically and mechanically coupling an integrated circuit to a supporting substrate wherein the structure has thermal expansion characteristics well-matched to the integrated circuit. What is further needed is a method of manufacturing such a structure.

SUMMARY OF THE INVENTION

Briefly, a structure suitable for connecting an integrated circuit to a supporting substrate wherein the structure has thermal expansion characteristics well-matched to the integrated circuit is an interposer. The integrated circuit and the interposer are comprised of bodies that have substantially similar coefficients of thermal expansion. The interposer has a first surface adapted to electrically and mechanically couple to the integrated circuit. The interposer has a second surface adapted to electrically and mechanically couple to a supporting substrate. Electrically conductive vias provide signal pathways between the first surface and the second surface of the interposer.

In a further aspect of the present of invention, various circuit elements may be incorporated into the interposer. These circuit elements may be active, passive, or a combination of active and passive elements.

BRIEF DESCRIPTION OF THE DRAWINGS

FIG. 7 is a schematic cross-section of an interposer after a deep-via has been etched therein.

FIG. 8 is a schematic cross-section showing the interposer of FIG. 7 after an insulating layer is formed on the sidewalls of the deep-via, and the deep-via is filled with an electrically conductive material.

FIG. 9 is a schematic cross-section showing the interposer of FIG. 8 after further metallization operations.

FIG. 10 is a schematic cross-section showing the interposer of FIG. 9 after still further metallization operations.

FIG. 11 is a schematic cross-section of an interposer with a first layer of metallization formed on the chip-side of the interposer.

FIG. 12 is a schematic cross-section showing the interposer of FIG. 11 after additional layers of chip-side metallization are formed.

FIG. 13 is a schematic cross-section showing the interposer of FIG. 12 after a deep-via is formed through the body of the interposer, and an insulating layer is formed on the sidewall surface of the deep-via.

FIG. 14 is a schematic cross-section showing the interposer of FIG. 13 after the deep-via is filled with an electrically conductive material.

FIG. 15 is a schematic cross-section of an interposer in accordance with the present invention after the chip-side and board-side layers of metallization have been polished back, and plated.

FIG. 16 is a schematic cross-section showing the interposer of FIG. 15 after formation of the Pb/Sn patterns that are used for chip-side solder bumps and board-side solder balls.

FIG. 17 is a flow diagram illustrating a process in accordance with the present invention.

FIG. 18 is a schematic cross-section of an interposer after a deep-via with sloped sidewalls has been etched therein.

FIG. 19 is a schematic cross-section showing the interposer of FIG. 18 after an insulating layer is formed on the sidewalls of the deep-via, and an electrically conductive material is formed in the deep-via.

FIG. 20 is a schematic cross-section showing the interposer of FIG. 19 after further metallization operations.

FIG. 21 is a schematic cross-section showing the interposer of FIG. 20 after still further metallization operations.

DETAILED DESCRIPTION

Overview

Figure 1:
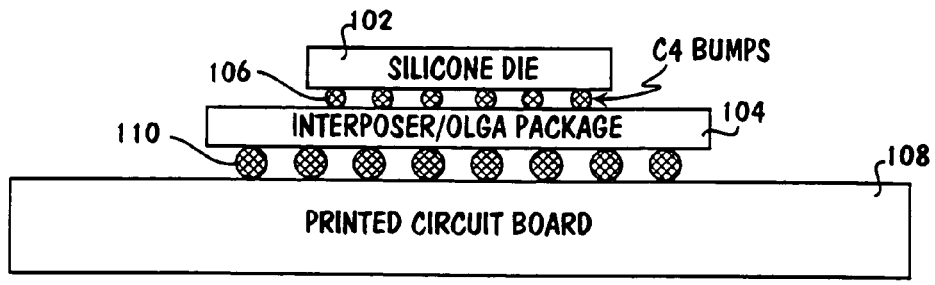
FIG. 1 is a schematic side-view of a silicon-based integrated circuit die coupled to an OLGA package by solder bumps, and the OLGA package coupled to a printed circuit board by solder balls.

Recent approaches to forming a connection between a silicon integrated circuit and a printed circuit board include the use of packages or interposers.

These packages and interposers provide, among other things, a space transformation function. That is, because the process used to manufacture integrated circuits and printed circuit boards result in substantially different interconnect pitches, the packages and interposers are therefore required to connect the narrow pitch I/O connection terminals of an integrated circuit with the relatively larger pitch I/O connection terminals of the printed circuit board. Typical packages and interposers are formed from materials substantially different from the materials that form the silicon integrated circuit. Problems associated with conventional package and interposer connection schemes include the difference in interconnect pitch required for connecting to the integrated circuit and the substrate, and the constraints on capacitance, resistance and inductance placed on the connections as they pass through the package or interposer between the integrated circuit and the substrate. With respect to the interconnect pitch, typical requirements for present day manufacturing include a tight pitch, typically less than $200\mu$, for interfacing with the integrated circuit, and coarse pitch, approximately 1 mm, for interfacing to a substrate such as printed circuit board.

With presently available technologies, Organic Land Grid Array (OLGA) packages cannot be used to make transistors. Additionally, the temperature constraints of OLGA packages are not conducive to forming dielectrics having a high dielectric constant, such as for example barium strontium titinate ($BaSrTiO_3$). Barium strontium titinate is also referred to as BST. Capacitors formed with materials having a high dielectric constant are w ll suited for use as decoupling capacitors. OLGA packages are also limited in terms of the interconnect pitch that can be achieved. A C4 bump pitch of greater than $200\mu$ has been needed when silicon integrated circuit die have been attached to OLGA packaging substrates because of the mismatch in their respective coefficients of thermal expansion. The use of silicon wafers for both integrated circuit die and interposer, in accordance with the present invention, substantially reduces this difference, and thereby reduces the mechanical stress that the C4 bumps would otherwise experience. This reduction of mechanical stress enables the use of smaller bumps and tighter pitches. In terms of present day manufacturing techniques, interconnect pitch on OLGA packages are limited to approximately $225\mu$ or larger.

Illustrative embodiments of the present invention use silicon-based interconnect technology to make an interposer, which in turn, may be used to replace OLGA or other types of packages for connecting silicon-based integrated circuits to substrates such as printed circuit boards. Interposers in accordance with the present invention can easily achieve the tight and coarse interconnect pitches, as well as the resistance, capacitance, and inductance requirements for interconnects formed on or in an interposer. Providing the space transform function from tight interconnect pitch at the chip to the relatively coarse interconnect pitch at the printed circuit board, or other type of supporting substrate, or circuit substrate, is also sometimes referred to as fanout. Additionally, embodiments of the present invention enable the integration of circuit elements, into the interposer.

The use of a silicon substrate for forming the interposer allows the integration of passive circuit elements, such as capacitors, and active circuit elements, such as transistors, on the interposer. These circuit elements can augment those that are used on an integrated circuit, and importantly, can be optimized separately from those of the integrated circuit. Capacitors integrated into the interposer may be used as decoupling capacitors.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), cobalt (Co), nickel (Ni) and tungsten (W) and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to materials having a lower dielectric constant than oxides of silicon. For example, organic polymers, nanofoams, silicon based insulators containing organic polymers, and fluorine containing oxides of silicon have lower dielectric constants than silicon dioxide.

The letter k, is often used to refer to dielectric constant. Similarly, the terms high-k, and low-k, are used in this field to refer to high dielectric constant and low dielectric constant respectively.

The term intralayer dielectric as used in this field is understood to refer to the dielectric material disposed between interconnect lines on a given interconnect level. That is, an intralayer dielectric is found between adjacent interconnect fines, rather than vertically above or below those interconnect lines.

Epitaxial layer refers to a layer of single crystal semiconductor material.

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. A FET can be viewed as a four terminal device when the semiconductor body is considered.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both.

Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The term vertical, as used herein, means substantially perpendicular to a surface of an object.

Referring to FIG. 1, a conventional arrangement is shown wherein a silicon-based integrated circuit die 102 is attached to an OLGA package 104. Solder bumps 106 are used to provide electrical connection between integrated circuit die 102 and OLGA package 104. Solder bumps 106 are sometimes referred to as C4 bumps because this style of interconnection is used in controlled collapse chip connection (i.e., C4) packaging. OLGA package 104 is attached to printed circuit board 108 by solder balls 110. Solder balls 108 provide electrical connection between OLGA package 104 and printed circuit board 108. In this way electrical connection between integrated circuit die 102 and printed circuit board 108 is made through OLGA package 104.

Figure 2:
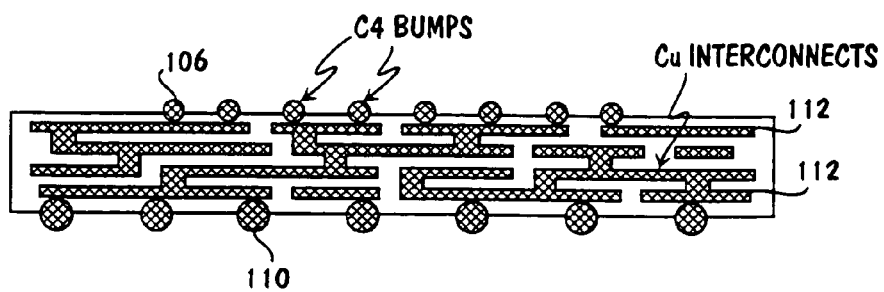
FIG. 2 is a schematic cross-section of an OLGA package.

FIG. 2 is a schematic cross-sectional view of OLGA 104. It can be seen that solder bumps 106 are electrically connected to solder balls 110 by interconnections 112. Interconnections 112 are typically metal lines on one or more interconnect levels. When more than one interconnect level is used, connections between metal lines on the various layers are typically achieved through the use of vias.

Figure 3:
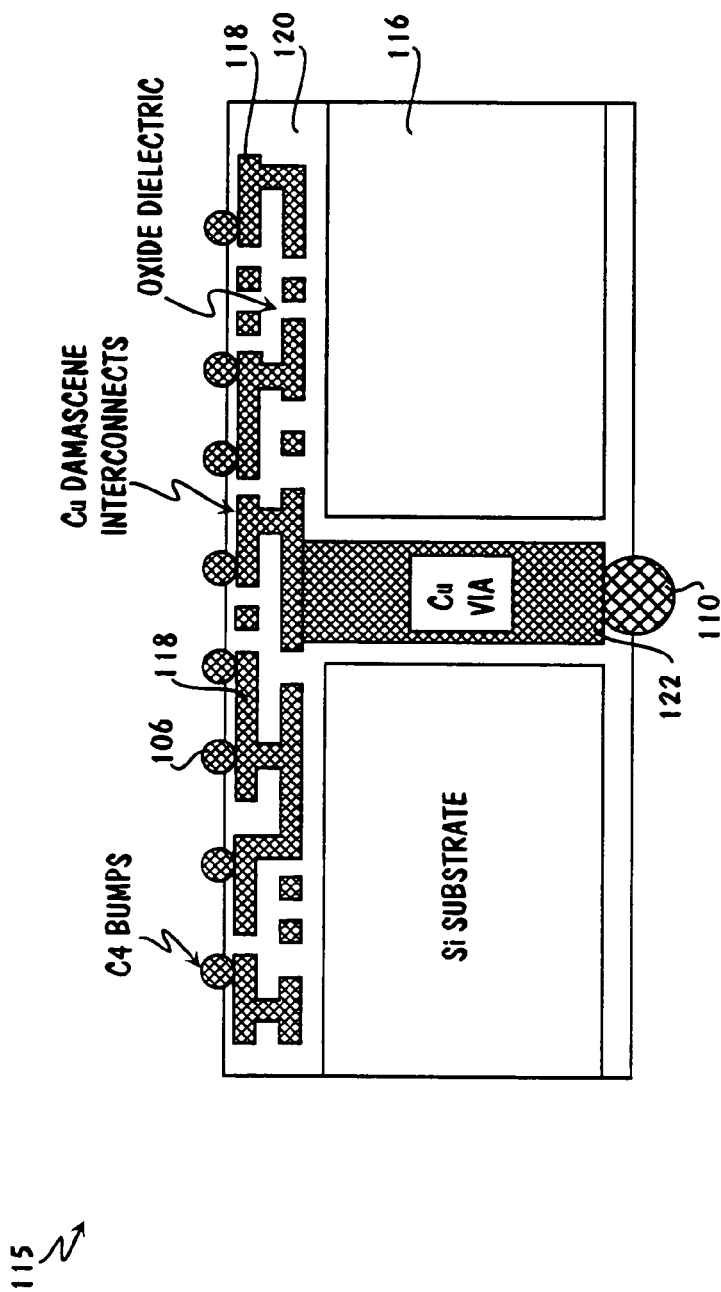
FIG. 3 is a schematic cross-section of a silicon-based interposer in accordance with the present invention.

FIG. 3 is a schematic cross-sectional view of one embodiment of an interposer 115 in accordance with the present invention. Interposer 115 includes a body portion 116, solder bumps 106, solder ball 110, interconnections 118, insulating material 120, and deep-via 122. In this illustrative embodiment, body portion 116 is a silicon substrate. Typically this silicon substrate is similar to the substrate used to produce integrated circuit die 102 which will be attached to interposer 115. Interconnections 118 may be formed from a metal such as copper, and may be formed by a damascene process, a dual damascene metal process, a subtractive meal process, or any other suitable method of forming conductive interconnections. Solder bumps 106 are adapted for connection to integrated circuit die 102. Solder balls 110 are adapted for connection to printed circuit board 108. Deep-via 122 is an electrically conductive pathway between a first side and a second side of interposer 115. The side of interposer 115 that is populated with solder bumps 106 may be referred to as the chip-side, or alternatively as the top-side, or front-side. The side of interposer 115 that is populated with solder balls 110 may be referred to as the board-side, or alternatively the bottom-side, or back-side.

Figure 4:
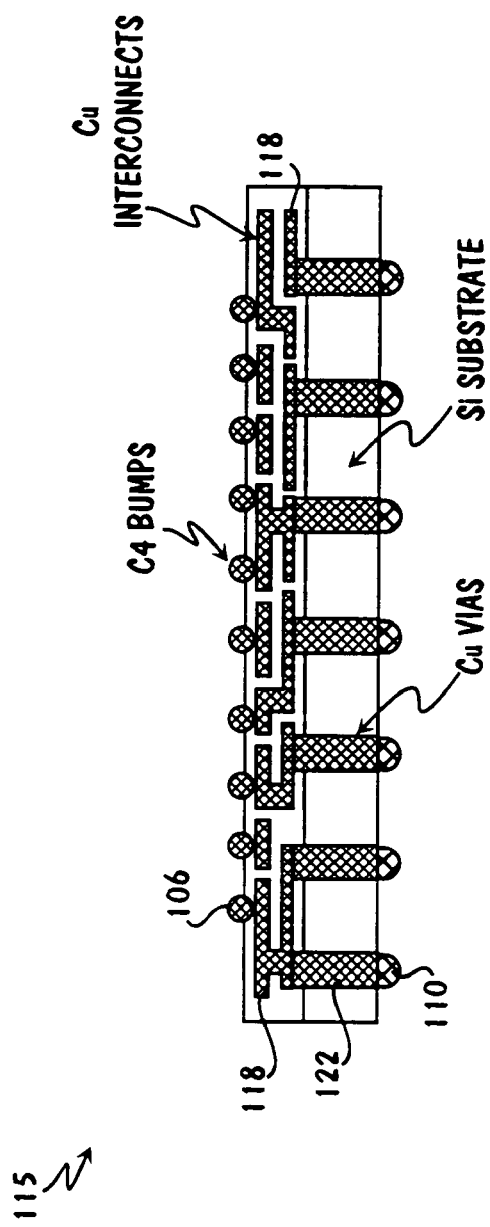
FIG. 4 is another schematic cross of a silicon-based interposer that shows a number of connection terminals.

FIG. 4 is another schematic cross-sectional view of an interposer 115 in accordance with the present invention. In this view it can be seen more clearly that a plurality of solder balls may be included as part of interposer 115. Additionally, it can be seen that the chip-side interconnection pitch is tighter than that of board-side interconnection pitch. Although no particular relationship between the pitch of the chip-side and board-side interconnections is required by the present invention, it is typical that the pitch of the chip-side interconnections is tighter, that is, smaller, than the pitch of the board-side interconnections.

Figure 5:
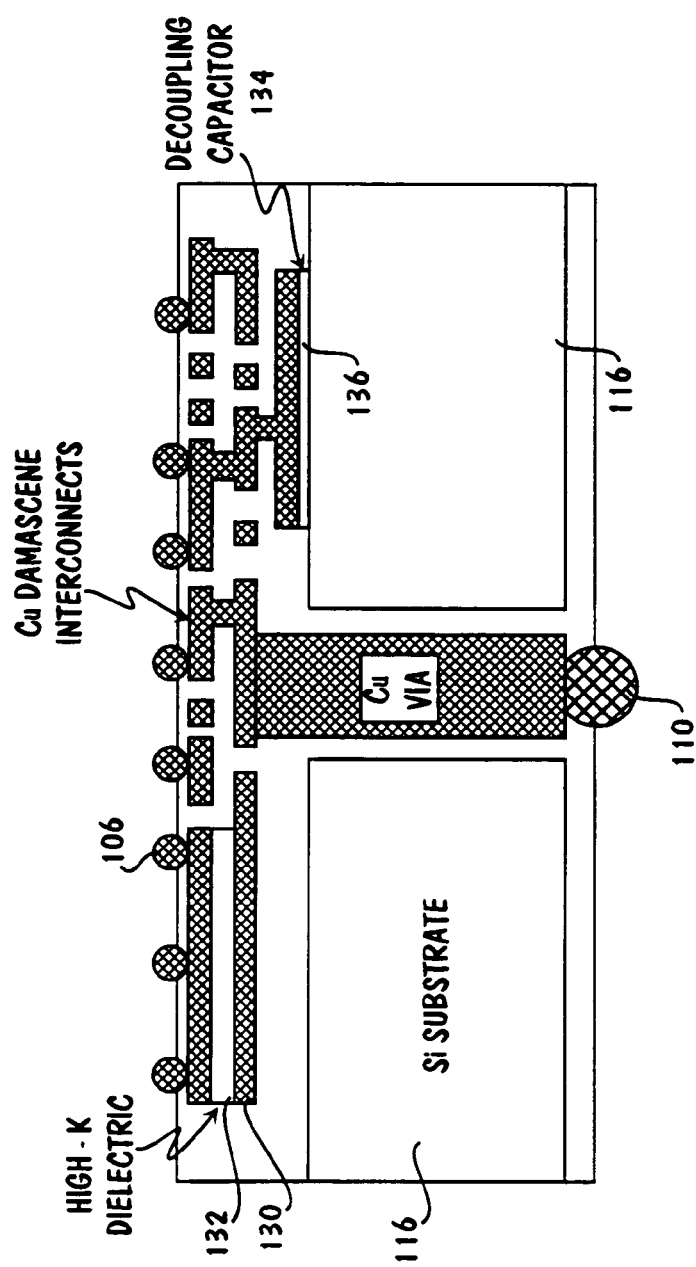
FIG. 5 is a schematic cross-section of a silicon-based interposer in accordance with the present invention that shows integrated decoupling capacitors.

FIG. 5 is another schematic cross-sectional view of an interposer 115 in accordance with the present invention. In this view it can be seen that capacitors 130 and 134 are integrated into interposer 115. Capacitor 130 includes a pair of metal plates and a dielectric layer 132. The metal plates are essentially the same as metal interconnects 118. This metal can be patterned into any desired shape, although typically capacitor 130 has rectangular plates. Dielectric material 132 may be a high dielectric constant material such as barium strontium titinate. Capacitor 134 includes the substrate, or body portion 116 as one plate, and a second plate which may be formed of a conductive material such as, but not limited to, a metal or doped polysilicon. A dielectric layer 136 may be a high dielectric constant material or it may be an oxide of silicon. No particular dielectric material, or dielectric thickness is required by the present invention. By placing decoupling capacitors closer to the integrated circuit die than would otherwise be possible with conventional packages and interposers, the undesirable parasitic inductance associated with the leads of the conventional arrangement is substantially reduced.

Figure 6:
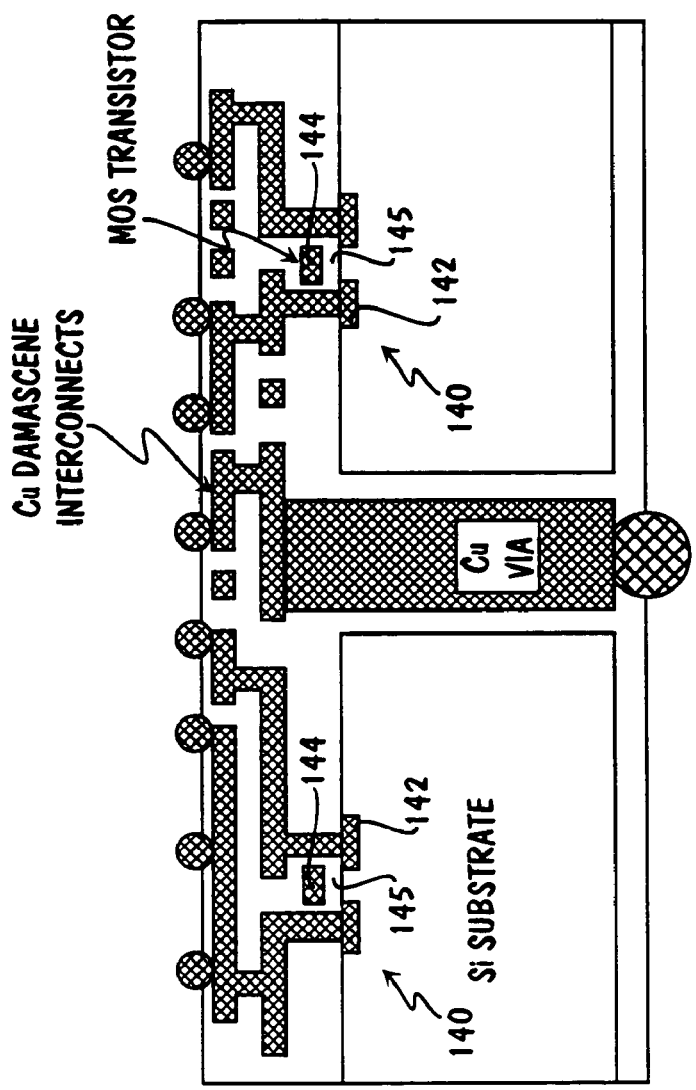
FIG. 6 is a schematic cross-section of a silicon-based interposer in accordance with the present invention that shows integrated transistors.

FIG. 6 is another schematic cross-sectional view of an interposer 115 in accordance with the present invention. In this view it can be seen that transistors 140 are integrated into interposer 115. Transistors 140 are insulated gate field effect transistors (FETs) and include source/drain terminals 142, gate electrodes 144, and gate dielectrics 145, as shown in FIG. 6. Transistors 140 may be n-channel FETs or p-channel FETs. Those of skill in the art and having the benefit of this disclosure will recognize that combinations of n-channel and p-channel FETs may be fabricated on substrate 116. The present invention does not require any particular electrical characteristics or physical dimensions for FETs 140. The present invention enables the integration of a variety of passive and active circuit elements into interposer 115.

By integrating various active and passive circuit elements into the interposer, it is possible to include circuit functionality into the interposer. For example, electrostatic discharge (ESD) protection circuits may be included on the interposer, thereby reducing the burden of incorporating all of such protection circuitry on the integrated circuit die which will be attached to the interposer. Similarly, other types of circuit functionality may be incorporated into the interposer. Examples include, but are not limited to, cache memory circuits, I/O buffer circuits, power regulation circuits, voltage level shifting circuits. Those skilled in the art and having the benefit of this disclosure will recognize that many circuit functions may be integrated into an interposer that offers active and passive circuit element in accordance with various embodiments of the present invention.

Transistors integrated into the interposer, may be, but do not need to be, made with the same manufacturing process as that used to produce the transistors formed on the integrated circuit die. For example, transistors on the integrated circuit die, and the circuits formed with them, may be designed to operate at a first range of voltages, whereas the transistors on the interposer, and the circuits formed with them, may be designed to operate at a second range of voltages. Similarly, various ones of the electrical characteristics of the circuit elements on the interposer may be different from the electrical characteristics of the circuit elements of the integrated die. Examples of electrical characteristics of field effect transistors that may differ between the interpos r and the integrated circuit die include, but are not limited to, threshold voltage, gate dielectric breakdown voltage, carrier mobility, off-state leakage current, junction leakage current, and junction capacitance. Since such electrical characteristics ar strong functions of the physical design of the transistors it is possible to tailor the circuit elements of the integrated circuit die and the interposer separately. For example, circuits on the interposer may be designed to operate at higher voltages than circuit on the integrated circuit die.

Referring to FIGS. 7–10, a process embodying the present invention is described. In this illustrative embodiment, deep-vias are formed through the substrate prior to top-side (i.e., chip-side) metallization operations.

Figure 7:
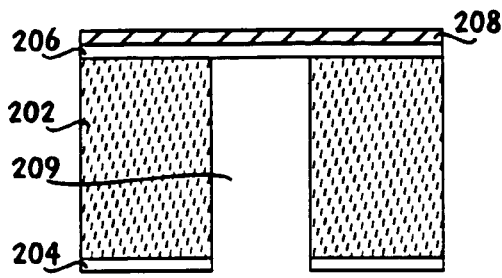
FIGS. 7–10 show various stages of manufacturing of a silicon-based interposer in accordance with a first illustrative embodiment of the present invention, wherein deep-vias are formed prior to chip-side interconnect formation.

As shown in FIG. 7, a silicon substrate 202 has a silicon dioxide ($SiO_2$) layer 204 and a $SiO_2$ layer 206 formed on opposing surfaces. In this particular embodiment, $SiO_2$ layers 204 and 206 are thermally grown to a thickness of approximately $0.5\mu$. A silicon nitride ($Si_3N_4$) layer 208, typically about $0.2\mu$ thick, is then formed superjacent $SiO_2$ layer 206. $Si_3N_4$ layer 208 may be formed by a plasma enhanced chemical vapor deposition (PECVD) operation. A masking layer for etching deep-vias, is then formed and patterned over the exposed surface of $SiO_2$ layer 204. The exposed portions of $SiO_2$ layer 204 are then etched, which exposes corresponding portions of silicon substrate 202. The exposed portions of silicon substrate 202 are then etched to form deep-via openings 209 as shown in FIG. 7. It should be understood that although one deep-via opening is shown for purposes of illustration in FIG. 7, a plurality of such deep-via openings are typically formed when manufacturing interposers in accordance with the present invention. The etch of deep-via opening 209 stops when $SiO_2$ layer 206 is reached. In other words, $SiO_2$ layer 206 acts as an etch stop layer during the formation of deep-via openings 209.

Figure 8:
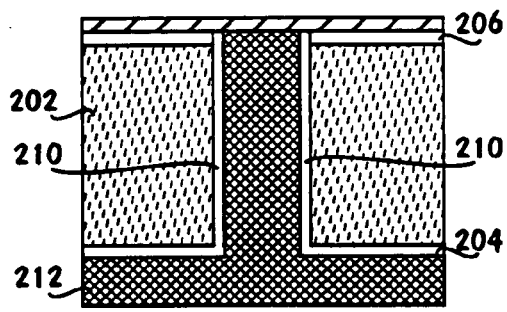

Referring to FIG. 8, it can be seen that subsequent to the formation of deep-via opening 209, that portion of $SiO_2$ layer 206 superjacent to deep-via opening 209 is etched. $Si_3N_4$ layer 208 acts as an etch stop layer for the etch of $SiO_2$ layer 206. An oxide layer 210 is then grown on the inner surfaces of deep-via opening 209. In the illustrative embodiment of the present invention described in conjunction with FIG. 8, oxide layer 210 is approximately $0.5\mu$ thick. Oxide layer 210 may also be referred to as a sidewall oxide layer. Subsequent to the formation of oxide layer 210, a barrier layer and a copper seed layer are sputter deposited into deep-via opening 209. The sputtered barrier layer may be Ta or TaN, having a thickness in the range of 10–50 nm. The sputtered seed layer is Cu, having a thickness in the range of 100–300 nm thick. Alternatively, the copper seed layer may be formed by a chemical vapor deposition (CVD). A CVD operation for the formation of the copper seed layer may provide better sidewall coverage.

A copper layer 212 is then electroplated resulting in deep-via 209 being substantially filled with copper, and a copper layer being disposed over the backside of the interposer. The backside of the interposer at this stage of processing includes $SiO_2$ layer 204, and the barrier and copper seed layers that were formed on $SiO_2$ layer 204, as well as the copper that has been electroplated thereon.

Figure 9:
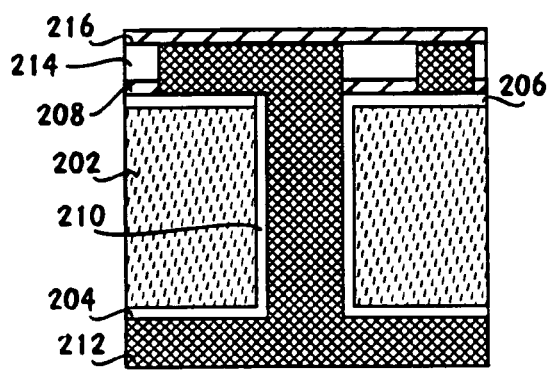

Referring now to FIG. 9, a $SiO_2$ layer 214 is deposited to a thickness of approximately $5\mu$ and disposed superjacent to silicon nitride layer 208. A masking layer (not shown), typically comprising photoresist, is then formed and patterned superjacent to $SiO_2$ layer 214. The pattern used is one which corresponds to trenches which are to be formed in oxide layer 214 and nitride layer 208 to facilitate a damascene copper metallization operation. Once the patterned masking layer is formed, exposed portions of oxide layer 214 are etched. This in turn exposes portions of nitride layer 208. The photoresist masking layer may then be removed. The exposed portions of nitride layer 208 are then etched. A copper barrier layer and a copper seed layer are then deposited over the chip-side surface of the interposer including into the trench formed by the etching of the oxide layer 214 and nitride layer 208 described above. A copper layer is electroplated over the copper seed layer. Copper layer substantially fills the trench and covers the surface of the barrier layer deposited over oxide layer 214. A planarization operation is then performed which polishes copper layer back such that excess copper and the corresponding underlying portions of the barrier layer are removed from the surface of oxide layer 214. This planarization/polish back operation is typically achieved by chemical mechanical polishing (CMP). Different slurry chemistries may be used for polishing the copper and the barrier layer in order to optimize the polishing operation. Subsequently, a silicon nitride layer 216 is deposited over copper layer and oxide layer 214 as shown in FIG. 9. Silicon nitride layer 216 is typically formed by a PECVD operation and formed to a thickness of approximately $0.1\mu$.

Figure 10:
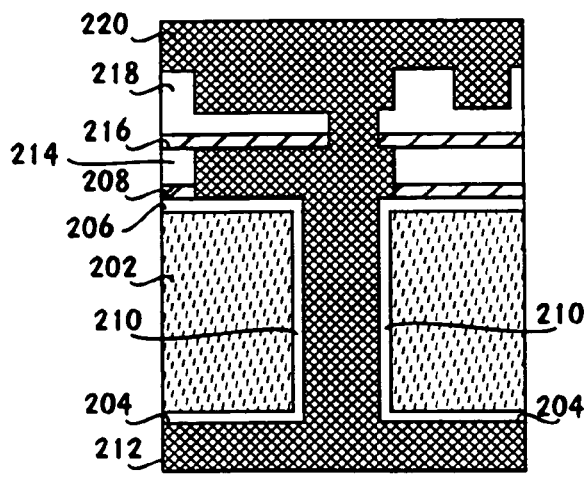

FIG. 10 shows the structure of FIG. 9 after additional insulative and dual damascene conductive layers are formed and patterned on the top-side of the interposer. An oxide layer 218 is deposited superjacent to nitride layer 216. Oxide layer 218 forms an inter-layer dielectric (ILD) and in the illustrative embodiment is formed to a thickness of approximately $10\mu$. In accordance with conventional dual damascene processing, a masking layer for an ILD via opening is patterned, and the ILD via opening is then etched in oxide layer 218. The ILD via opening masking layer is then removed. A masking layer for a metal-2 (M2) trench is then patterned, and an M2 trench is etched in oxide layer 218. The M2 trench masking layer is then removed and the portion of silicon nitride layer 216 that is exposed at the bottom of the ILD via opening is then etched, exposing an underlying layer of copper. A copper barrier layer and a copper seed layer are then sputtered into the M2 trench and ILD via opening. A copper layer 220 is then electroplated onto the copper seed layer. Copper layer 220 fills the ILD via opening and the M2 trench, and forms over oxide layer 218.

Referring to FIGS. 11–14, an alternative process embodying the present invention is described. In this illustrative embodiment, deep-vias are formed through the substrate subsequent to top-side (i.e., chip-side) metallization operations.

Figure 11:
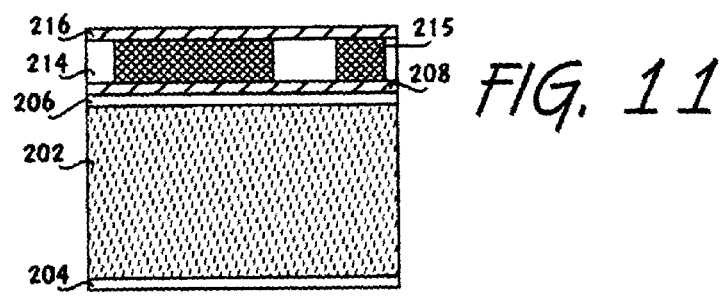
FIGS. 11–14 show various stages of manufacturing of a silicon-based interposer in accordance with a second illustrative embodiment of the present invention, wherein deep-vias are formed subsequent to chip-side interconnect formation.

As shown in FIG. 11, a silicon substrate 202 has a silicon dioxide ($SiO_2$) layer 204 and a silicon dioxide ($SiO_2$) layer 206 formed on opposing surfaces. In this particular embodiment, $SiO_2$ layers 204 and 206 are thermally grown to a thickness of approximately $0.5\mu$. A silicon nitride ($Si_3N_4$) layer 208, typically about $0.2\mu$ thick, is then formed superjacent $SiO_2$ layer 206. $Si_3N_4$ layer 208 may be formed by a plasma enhanced chemical vapor deposition (PECVD) operation. A $SiO_2$ layer 214 may then be formed as an inter-layer dielectric. In this illustrative embodiment $SiO_2$ layer 214 is deposited over $Si_3N_4$ layer 208 to a thickness of approximately $5\mu$. A masking layer (not shown), typically a photoresist layer is then formed over $SiO_2$ layer 214 and patterned so as to expose those portions of $SiO_2$ layer 214 that are to be removed to form trenches for a damascene metal process. After patterning the photoresist, the exposed portions of $SiO_2$ layer 214 are etched. Silicon nitride layer 208 serves as an etch stop layer for this $SiO_2$ etch operation. Subsequent to the $SiO_2$ etch operation the photoresist is removed. A copper barrier layer and copper seed layer are then sputter deposited onto the chip-side surface of the interposer. The barrier layer is typically a material such as Ta or TaN, which are electrically conductive, present a migration barrier to copper, and act as an adhesion layer for the copper. Copper is then electroplated onto the seed layer such that the trenches are filled with copper and a copper layer is also formed over the remaining portions of the chip-side surface. That portion of copper formed outside the trenches is considered to be excess. A chemical mechanical polishing operation is then performed to remove the excess copper. This results in the individual copper interconnect lines 215 as shown in schematic cross-section in FIG. 11. A $Si_3N_4$ layer 216 is then deposited over the chip-side surface of the interposer. $Si_3N_4$ layer 216 is typically formed by a PECVD operation and is typically formed to a thickness of approximately $0.1\mu$. $Si_3N_4$ layer 216 serves as an etch stop layer for subsequent via formation operations, and also acts as a barrier to copper migration.

With respect to the removal of the excess copper described above, since the excess copper is disposed upon a barrier layer which potentially has different chemical and mechanical properties. the CMP conditions including, but not limited to, slurry chemistry, down-force, rotation sp ed, temperature, and so on, may be varied as between the copper layer and the barrier layer to achieve the desired result.

Figure 12:
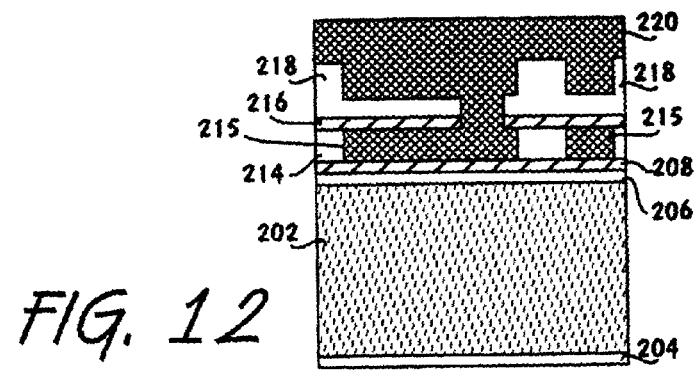

FIG. 12 shows the structure of FIG. 11 after further processing operations are performed in order to produce an additional level of metal interconnect lines. In this illustrative embodiment, a dual damascene metallization process is used to form the additional interconnect lines and vias between interconnect levels. Those skilled in the art and having the benefit of this disclosure will appreciate that several levels of interconnect may be fabricated in this fashion. In this illustrative embodiment a $SiO_2$ layer 218 is deposited over $Si_3N_4$ layer 216 to a thickness of approximately $10\mu$ to form an inter-layer dielectric (ILD). A first masking layer (not shown), typically a photoresist layer is then formed over $SiO_2$ layer 218 and patterned so as to expose those portions of $SiO_2$ layer 218 that are to be removed to form via openings for a dual damascene metal process. After patterning the photoresist, the exposed portions of $SiO_2$ layer 218 are etched. Silicon nitride layer 216 serves as an etch stop layer for this $SiO_2$ etch operation. Subsequent to the $SiO_2$ etch operation the photoresist is removed. A second masking layer (not shown) is formed over $SiO_2$ layer 218 and patterned so as to expose those portions of $SiO_2$ layer 218 that are to be etched to form trenches for the metal interconnect lines. The trench etch removes the exposed $SiO_2$ to a depth that substantially corresponds to the desired thickness of the metal interconnect lines. The second masking layer is then removed. Those portions of silicon nitride layer 216 that are exposed at the bottom of the via openings are then etched, thereby exposing the underlying copper interconnect lines 215. A copper barrier layer and copper seed layer are then sputter deposited onto the chip-side surface of the interposer. Copper is then electroplated onto the seed layer such that the vias and trenches are filled with copper and a copper layer is also formed over the remaining portions of the chip-side surface. That portion of copper formed outside the trenches is considered to be excess.

Figure 13:
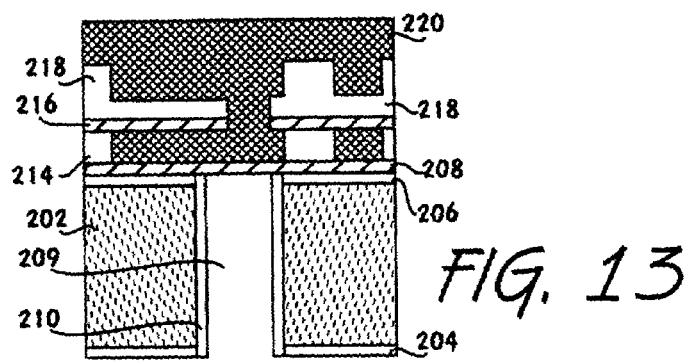

FIG. 13 shows the structure of FIG. 12 after further processing operations are performed in order to produce a deep-via opening 209. A masking layer, such as photoresist (not shown), is formed and patterned on the backside (i.e., board side) of the interposer so as to expose those portions of oxide layer 204 that are to be removed for the formation of deep-vias 209. The exposed portions of oxide layer 204 are then etched thereby exposing portions of silicon substrate, or body, 202, of the interposer. Deep-via opening 209 is then etched through silicon substrate 202 with oxide layer 206 acting as an etch stop layer. Although shown in cross-section, deep-via openings 209 are not limited to any particular shape, and may be circular, rectangular, or have some complex polygonal shape when the openings are viewed from the back-side surface. Subsequent to the formation of deep-via opening 209, a layer of $SiO_2$ 210 is formed on the exposed inner surfaces, also referred to as the sidewalls, of deep-via opening 209. $SiO_2$ layer 210 in the illustrative embodiment is approximately $0.5\mu$ thick, and may be deposited by a chemical vapor deposition (CVD) process. Portions of oxide layer 206 that are exposed by deep-vias 209 are then etched. As can be seen in FIG. 13, removing the exposed portions of oxide layer 206 exposes corresponding portions of silicon nitride layer 208. The exposed portions of silicon nitride layer 208 are then etched so as to expose corresponding portions of copper layer 215.

Figure 14:
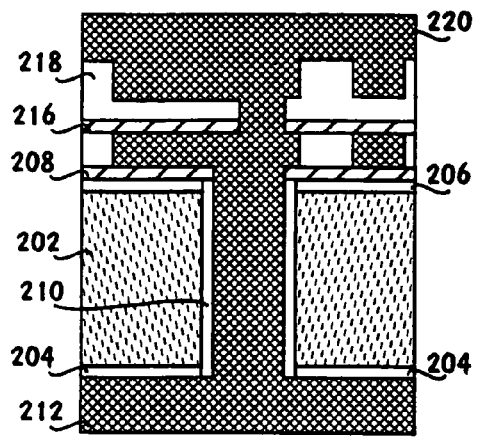

FIG. 14 shows the structure of FIG. 13 after further processing operations are performed in order to produce copper layer 212 which fills deep-via opening 209, and also covers oxide layer 204 on the backside of the interposer. As indicated in FIG. 14, those portions of silicon nitride layer 208 that are exposed by deep-via opening 209 are removed by etching. A copper barrier layer and copper seed layer are then sputter deposited into deep-via opening 209. Copper is then electroplated into deep-via opening 209 and onto the backside surface of the interposer.

Figure 15:
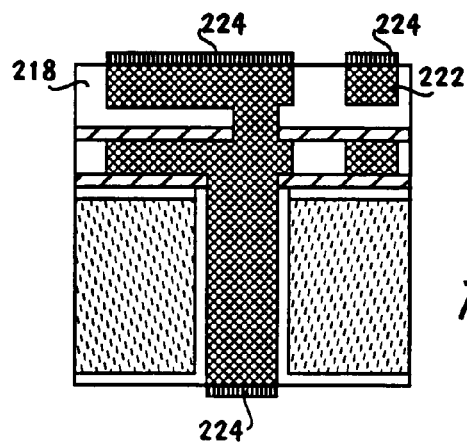
FIGS. 15–16 are common to both the process illustrated in FIGS. 7–10, and the process illustrated in FIGS. 11–14.
Figure 16:
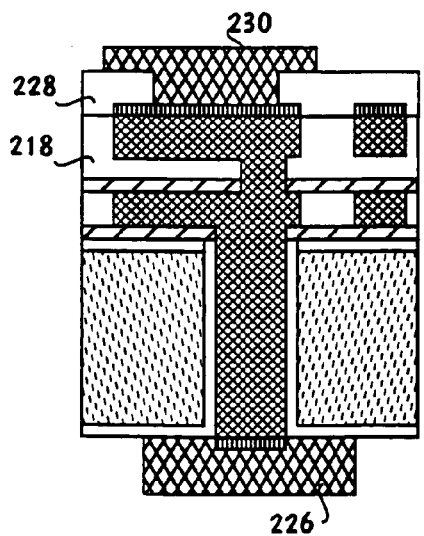

FIGS. 15–16 illustrate processing operation that ar common to both the processes shown and described in connection with FIGS. 7–10 (the deep-via first process) and with FIGS. 11–14 (the deep-via last process).

Referring to FIG. 15, excess copper on the board-side of the interposer is removed by CMP. As will be appreciated by those skilled in the art, a two step CMP process may be used wherein a first slurry chemistry is used to remove copper and a second slurry chemistry is used to remove the barrier layer. Similarly, excess copper, as well as, the unneeded portions of the barrier layer on the chip-side of the interposer are removed by CMP. The remaining exposed copper is then subjected to an electroless Ni/Au plating operation such that Ni/Au layers 224 are formed on both the chip-side and the board-side of the interposer. The electroless chemistry provides a selective deposition on the exposed metal surfaces.

FIG. 16 shows the structure of FIG. 15 after several additional processing operations are performed in order to produce the screen printed eutectic solder that is used to attach an integrated circuit die to the interposer, and the interposer to the circuit substrate. More particularly, the structure shown in FIG. 15, is subjected to a Pb/Sn sputter deposition operation on its backside, i.e., its board-side. The Pb/Sn layer formed by this sputter is then patterned, with conventional lithographic methods, to form solder ball precursor structure 226. Subsequently, a polyimide layer 228 is formed on the chip-side of the interposer as illustrated in FIG. 16. Polyimide layer 228 is then patterned, with conventional lithographic methods, to expose portions Ni/Au layers 224. Another Pb/Sn sputter deposition operation is performed to produce a layer of Pb/Sn covering the top-side, i.e., chip-side of the interposer. The chip-side layer of Pb/Sn is then patterned to form the solder bump precursor structure 230 as illustrated in FIG. 16. Those skilled in the art and having the benefit of this disclosure will recognize that the ordering of certain process operations may be varied and still achieve the desired structure. All such variations in the ordering of the process operations are considered to be within the scope of the present invention.

FIG. 17 is a flow diagram illustrating a process in accordance with the present invention. An integrated circuit and an interposer are coupled 302. In accordance with the principles of the present invention, the interposer and the integrated circuit have substantially similar coefficients of thermal expansion. In particular embodiments, the interposer and the integrated circuit have substrates, also referred to as bodies, that are made from substantially the same material. As an example, the interposer and the integrated circuit may both be fabricated from silicon substrates. In the case where the interposer is made from a material such as silicon, various circuit elements, including but not limited to, capacitors and transistors, may be formed therein by conventional semiconductor manufacturing methods. A circuit substrate, for example a printed circuit board, and the interposer are also coupled 304. The interposer provides a mechanical connection between the integrated circuit and the circuit substrate. Additionally, the interposer provides conductive signal pathways through its body so as to electrically couple the integrated circuit with the circuit substrate.

Another alternative embodiment of the present invention is described in conjunction with FIGS. 18–21 which show various stages of manufacturing of a silicon-based interposer, wherein deep-vias are formed with a two stage process that results in sloped sidewalls in a first portion of the deep-vias. The process of forming this interposer structure is similar to the one described in connection with the embodiment shown in FIGS. 7–10, except that the deep-vias are formed with a portion of their sidewalls being sloped, rather than substantially vertical.

Figure 18:
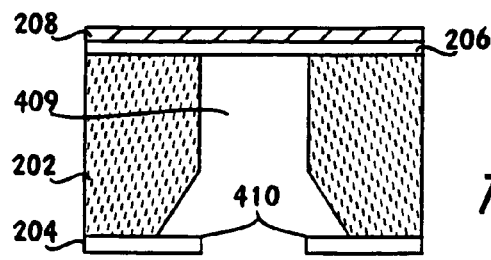
FIGS. 18–21 show various stages of manufacturing of a silicon-based interposer in accordance with a third illustrative embodiment of the present invention, wherein deep-vias are formed with a two stage process that results in sloped sidewalls in a first portion of the deep-vias.

Referring to FIG. 18, a schematic cross-section of an interposer is shown after a deep-via opening with sloped sidewalls has been etched therein. More particularly, a silicon substrate 202 has silicon oxide layers 204, 206, about 0.5$\mu$ thick, thermally grown on each major surface thereof. A layer of silicon nitride is then deposited to a thickness of about 0.1$\mu$ superjacent oxide layer 206. A deep-via masking layer is then patterned so as to coat oxide layer 204, except for the areas that are to be etched to form the deep-via openings. The exposed portions of oxide layer 204 are then etched, thereby exposing portions of substrate 202. An isotropic etch of silicon substrate 202 is then performed to produce sloped sidewalls partially through silicon substrate 202 as shown in FIG. 18. An anisotropic etch is then performed to complete deep-via opening 409 as shown in FIG. 18. The combination of anisotropic and isotropic etching creates an oxide overhang portion 410.

Figure 19:
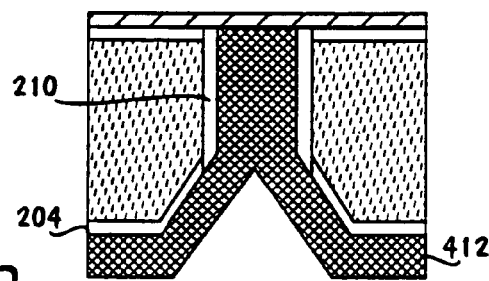

FIG. 19 is a schematic cross-section showing the interposer of FIG. 18 after an insulating layer is formed on the sidewalls of the deep-via, and an electrically conductive material is formed in the deep-via. Overhang 410 is removed by a wet etch designed to remove half the thickness of oxide layer 204. Since both sides of overhang 410 are exposed to the wet etchant, the overhang is effectively etched at twice the rate of oxide layer 204. After removal of overhang 410, a sidewall oxide 210 is grown over the sloped and vertical portions of the deep-via sidewalls to a thickness of about 0.5$\mu$. A copper diffusion barrier and seed layer are then sputter deposited into deep-via opening 409. Copper is then electroplated so as to substantially fill that portion of deep-via opening 409 having substantially vertical sidewalls, to provide a conductive coating over the sloped sidewall of deep via 409, and to provide a conductive layer over oxide layer 204. The copper follows the sloped sidewall of deep-via opening 409 so that a groove type structure is formed, as shown in FIG. 19.

Figure 20:
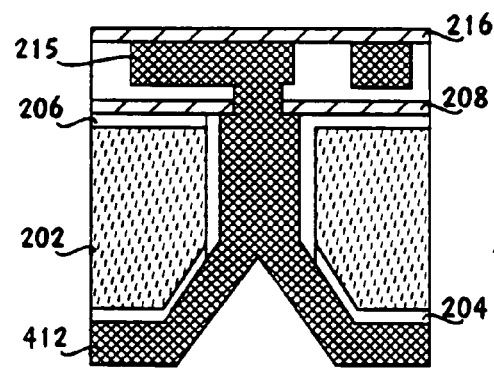
Figure 21:
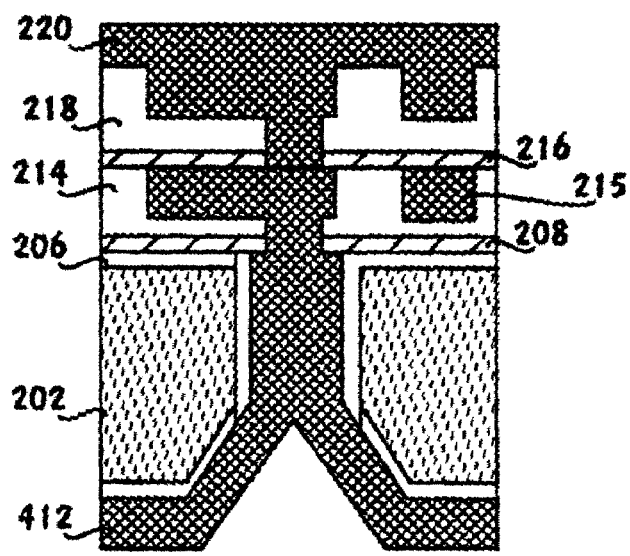

FIGS. 20–21 show the formation of two metal layers and two layers of vias. Each of these metal and via pairs is formed by the dual damascene metal process described above in connection with FIGS. 9–10 and FIGS. 13–14.

CONCLUSION

Embodiments of the present invention provide an interposer suitable for electrically and mechanically coupling an integrated circuit die to a substrate, while further providing a good match of thermal expansion characteristics, tight interconnect pitch, and integration of active and passive circuit elements into the interposer.

An advantage of particular embodiments of the present invention is that high dielectric constant materials may be easily integrated into the interposer.

This facilitates the formation of capacitors that may be used as, among other things, decoupling capacitors.

An advantage of particular embodiments of the present invention is that field effect transistors may be easily integrated into the interposer.

It will be understood by those skilled in the art and having the benefit of this disclosure that many design choices are possible within the scope of the present invention. For example, the bodies of the integrated circuit die and the interposer may be formed from material other than silicon. Similarly, conductive materials other than copper may be used to form the various interconnects on the interposer or the integrated circuit. Another alternative includes substituting an adhesion layer for the copper barrier layer on interposers that do not incorporate transistors, or that have large spacings between transistors. Examples of such adhesion layer materials include, but are not limited to, Ti and TiN. An example of a further alternative is the use of low-k materials including, but not limited to, fluorine doped oxides of silicon, rather than $SiO_2$, as the inter-layer dielectric.

It will be understood that various other changes in the details, materials, and arrangements of the parts and steps which have been described and illustrated may be made by those skilled in the art having the benefit of this disclosure without departing from the principles and scope of the invention as expressed in the subjoined claims.

What is claimed is:

1. A method of making an interposer, comprising:
   forming an oxide layer on each of a first surface and a second surface of a substrate;
   patterning the oxide layer of the first surface to expose a first portion and a second portion of the substrate;
   isotropically etching through the first portion of the exposed substrate to form a first portion of at least one deep-via opening;
   anisotropically etching through the second portion of the exposed substrate to form a second portion of the at least one deep-via opening;
   growing an oxide layer on inner surfaces of the at least one deep-via opening;
   sputtering a copper barrier layer and a copper seed layer into the first and second portions of the at least one deep-via opening after growing the oxide layer;
   electroplating a conductive material over the seed layer to form the at least one deep-via; and
   forming vias and interconnect lines over the second surface of the substrate.

2. The method of claim 1 wherein the interconnect lines are electrically coupled to the at least one deep-via opening.

3. The method of claim 1 wherein the oxide layer is thermally grown to a thickness of approximately 0.5 um.

4. The method of claim 1 wherein the copper barrier layer is of a thickness in a range of 10–50 nm.

5. The method of claim 1 wherein the copper seed layer is of a thickness in a range of 100–300 nm.

6. The method of claim 1 further comprising depositing a copper layer over the first surface of the substrate.

7. The method of claim 1 further comprising:
   forming a silicon nitride layer over the second surface of the substrate;
   depositing an oxide layer superjacent to the silicon nitride layer;
   patterning the oxide layer to expose portions of the silicon nitride layer;
   etching the exposed portions of the silicon nitride layer;
   depositing a copper barrier layer and a copper seed layer over the second surface of the substrate; and
   electroplating a conductive material over the copper seed layer.

* * * * *